(12) United States Patent
Ito et al.

(10) Patent No.: US 7,947,964 B2
(45) Date of Patent: May 24, 2011

(54) CHARGED PARTICLE BEAM ORBIT CORRECTOR AND CHARGED PARTICLE BEAM APPARATUS

(75) Inventors: Hiroyuki Ito, Hitachinaka (JP); Yuko Sasaki, Mito (JP); Tohru Ishitani, Hitachinaka (JP); Yoshinori Nakayama, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 182 days.

(21) Appl. No.: 11/943,241

(22) Filed: Nov. 20, 2007

(65) Prior Publication Data
US 2008/0116391 A1 May 22, 2008

(30) Foreign Application Priority Data

Nov. 21, 2006 (JP) ................................. 2006-313816

(51) Int. Cl.
*G21K 1/087* (2006.01)
(52) U.S. Cl. ................ 250/396 ML; 250/310; 250/311; 250/369 R; 250/492.1; 250/492.3
(58) Field of Classification Search ........... 250/396 ML, 250/396 R, 306, 310, 311, 491.1, 492.1, 492.2, 250/492.3
See application file for complete search history.

(56) References Cited

U.S. PATENT DOCUMENTS

| | | | | |
|---|---|---|---|---|
| 3,100,260 A | * | 8/1963 | Wilska | 250/396 R |
| 3,151,259 A | * | 9/1964 | Per Gloersen et al. | 310/11 |
| 3,614,520 A | * | 10/1971 | Coleman | 315/15 |
| 3,749,964 A | * | 7/1973 | Hirata | 250/398 |
| 3,911,321 A | * | 10/1975 | Wardly | 315/364 |
| 4,209,698 A | * | 6/1980 | Hoppe | 250/311 |
| 5,041,731 A | * | 8/1991 | Oae et al. | 250/396 ML |
| 5,393,983 A | * | 2/1995 | Hosoki | 250/396 ML |

(Continued)

FOREIGN PATENT DOCUMENTS

JP 2000-12454 A 1/2000

(Continued)

OTHER PUBLICATIONS

Harald Rose, "Outline of an Ultracorrector Compensating for all Primary Chromatic and geometrical Aberrations of Charged-Particle Lenses" Nuclear Instruments & Methods in Physics Research Section A, 519, 12(2004).

(Continued)

*Primary Examiner* — Bernard E Souw
*Assistant Examiner* — Michael J Logie
(74) *Attorney, Agent, or Firm* — Crowell & Moring LLP

(57) ABSTRACT

The present invention relates to an orbit correction method for a charged particle beam, and aims to solve problems inherent in conventional aberration correction systems and to provide a low-cost, high-precision, high-resolution optical converging system for a charged particle beam. To this end, employed is a configuration in which a beam orbit is limited in ring zone form to form a distribution of electromagnetic field converging toward the center of a beam orbit axis. Consequently, a nonlinear action outwardly augmented, typified by spherical aberration of an electron lens, can be cancelled out. Specifically, this effect can be achieved by an electron disposed on the axis and subjected to a voltage to facilitate the occurrence of electrostatic focusing. For a magnetic field, this effect can be achieved by forming a coil radially distributed-wound on a surface equiangularly divided in the direction of rotation to control convergence of a magnetic flux density.

18 Claims, 18 Drawing Sheets

1 Beam
4 Rotation symmetry axis
9 Exciting coil
10 Inner cylinder
11 Outer cylinder

U.S. PATENT DOCUMENTS

| | | | |
|---|---|---|---|
| 5,719,542 A * | 2/1998 | Park et al. | 335/213 |
| 5,757,121 A * | 5/1998 | Nakata | 313/440 |
| 5,831,270 A * | 11/1998 | Nakasuji | 250/396 ML |
| 5,894,124 A * | 4/1999 | Iwabuchi et al. | 250/310 |
| 6,084,238 A * | 7/2000 | Todokoro et al. | 250/310 |
| 6,414,323 B1 * | 7/2002 | Abe et al. | 250/443.1 |
| 6,441,384 B1 * | 8/2002 | Kojima | 250/492.23 |
| 6,642,525 B2 * | 11/2003 | Kienzle et al. | 250/396 ML |
| 7,075,075 B2 * | 7/2006 | Adamec et al. | 250/310 |
| 7,186,975 B2 * | 3/2007 | Ishitani et al. | 250/310 |
| 7,223,983 B2 * | 5/2007 | Kawasaki et al. | 250/398 |
| 7,420,179 B2 * | 9/2008 | Hosokawa | 250/396 ML |
| 2002/0074524 A1 * | 6/2002 | Nakano | 250/505.1 |
| 2004/0036030 A1 * | 2/2004 | Matsuya et al. | 250/396 R |
| 2005/0161600 A1 * | 7/2005 | Ezumi et al. | 250/310 |

FOREIGN PATENT DOCUMENTS

| | | |
|---|---|---|
| JP | 2006-80155 A | 3/2006 |

OTHER PUBLICATIONS

W. Stickel, et al, "Evolution of Electron Projection optics From Variable Axis Immersion Lenses to Projection Reduction Exposure with Variable Axis Immersion Lenses" J. Vac. Sci. Technol. B 20(6), Nov./Dec. (2002) American Vacuum Society.

\* cited by examiner

Conventional type of lens

Axial lens (of potential of same sign as that of beam)

Axial lens (of potential of different sign from that of beam)

Example of correction using combination of conventional lens and axial lens

Example of correction using combination of axial lenses

1 Beam
2 Axial electrode
3 Off-axis electrode
4 Rotation symmetry axis
5 Sample surface Conventional lens Axial lens under diverging conditions Axial lens under converging conditions FIG. 5A
FIG. 5B
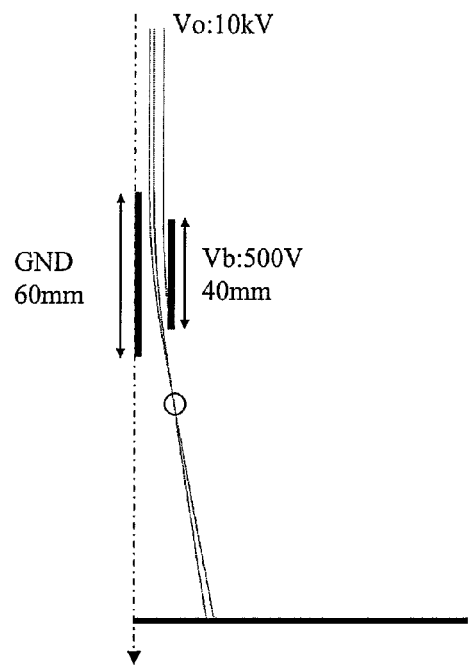
Cylindrical off-axis electrode
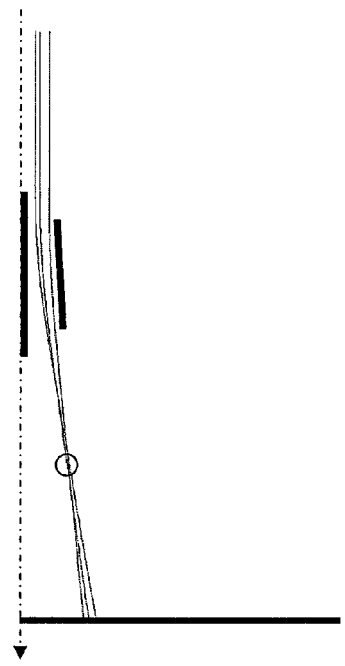
Conical off-axis electrode 2 Axial electrode
3 Off-axis electrode
6 Ring zone aperture
7 Support 2 Axial electrode
3 Off-axis electrode
4 Rotation symmetry axis
6 Ring zone aperture
7 Support
8 Insulator 1 Beam
4 Rotation symmetry axis
9 Exciting coil
10 Inner cylinder
11 Outer cylinder 2 Axial electrode
3 Off-axis electrode
5 Sample surface
6 Ring zone aperture
12 Paraxial trajectory
13 Off-axis trajectory
14 Objective lens 2 Axial electrode
3 Off-axis electrode
4 Rotation symmetry axis
5 Sample surface
6 Ring zone aperture
12 Paraxial trajectory
13 Off-axis trajectory
14 Objective lens
15 Entrance lens 1 Beam
2 Axial electrode
3 Off-axis electrode
5 Sample surface
6 Ring zone aperture
14 Objective lens
15 Entrance lens
16 Projection lens
17 Deflector
18 Transverse magnetic field corrector
19 High-energy paraxial trajectory
20 Low-energy paraxial trajectory
21 High-energy deflected trajectory
22 Low-energy deflected trajectory

| | |
|---|---|
| 1  Beam | 24  Limiting aperture |
| 2  Axial electrode | 25  Shield |
| 3  Off-axis electrode | 26  Cooling device |
| 5  Sample surface | 27  Driving circuit |
| 6  Ring zone aperture | 28  Correction calculation circuit |
| 14  Objective lens | 29  Height sensor |
| 15  Entrance lens | 30  Surface potential electrometer |
| 16  Projection lens | 31  Signal electrons |
| 17  Deflector | 32  Detector |
| 23  Electron source | |

1 Beam
2 Axial electrode
3 Off-axis electrode
5 Sample surface
6 Ring zone aperture
14 Objective lens
15 Entrance lens 23 Electron source
33 Heater
34 Intermediate lens
35 Magnifying lens
36 Projection plane 1 Beam
2 Axial electrode
3 Off-axis electrode
5 Sample surface
14 Objective lens
15 Entrance lens
16 Projection lens
17 Deflector
24 Limiting aperture
37 Blanking aperture 1 Beam
2 Axial electrode
4 Rotation symmetry axis
5 Sample surface
38 Aligner
39 Multipolar electrode 2 Axial electrode
3 Multipolar electrode 1 Beam
4 Rotation symmetry axis
9 Exciting coil 1 Beam
4 Rotation symmetry axis
5 Sample surface
31 Signal electrons
40 Superconducting coil
41 Cooling/introducing unit
42 Liquefied helium tank
43 Heat exchanger

CHARGED PARTICLE BEAM ORBIT CORRECTOR AND CHARGED PARTICLE BEAM APPARATUS

CLAIM OF PRIORITY

The present application claims priority from Japanese application JP 2006-313816 filed on Nov. 21, 2006, the content of which is hereby incorporated by reference into this application.

BACKGROUND OF THE INVENTION

1. Field of the Invention

The present invention relates to an orbit correction apparatus for a charged particle beam optical system, and a charged particle beam apparatus, such as an electron microscope, having the same.

2. Description of the Related Art

A charged particle beam apparatus plays an important role in a wide field of nanotechnology. The charged particle beam apparatuses include a scanning electron microscope (SEM) that scans a focused beam of electrons over the surface of a sample, detects signal electrons from the surface of the sample, and makes the detected signal visible on an image display device; a transmission electron microscope that allows electrons to pass through a sample and focuses the diverging electrons through an electron lens into an image; an electron beam exposure system that subjects a sample to patterning by irradiating the surface of the sample with a shaped beam of electrons; and a focused ion beam apparatus that subjects a sample to a process by irradiating the sample with a focused ion beam. To bring these charged particle beams into convergence, the electron lens formed of rotationally symmetrical electrodes or magnetic poles is used because of having good controllability and processability.

A problem with such an electron lens system is electro-optical aberration. For example, an electromagnetic lens of rotationally symmetrical configuration functions as a convex lens because of having increased magnetic field intensity and hence an augmented converging action axially outwardly in the vicinity of a magnetic pole. Moreover, aberration that is a higher-order perturbation component of the lens causes a phenomenon in which a charged particle beam emitted from a given point does not converge to a point due to being dispersed depending on conditions of entrance of the beam into the lens. Even with the use of an ideal point source of light, the occurrence of the phenomenon leads to the occurrence of a finite spread of an image point, namely, what is known as beam defocusing, depending on a radiation angle distribution or a central orbit axis of the point source. The aberration can possibly cause deterioration in resolving power for sample observation using a focused beam of charged particles, or serious deterioration in accuracy of microfabrication.

According to perturbation aberration theory, it is known that, because of the occurrence of spherical aberration proportional to the third power of an incident angle α of a beam and chromatic aberration proportional to a deviation dV relative to accelerating energy V, the amount δ of departure of a beam orbit on the axis can be expressed in equation form as:

$$\delta = Cs\alpha^3 + CcdV/V + \ldots \quad (1)$$

where Cs denotes a spherical aberration coefficient and Cc denotes a chromatic aberration coefficient. Other contributions take place outside the axis. At this point, beam defocusing occurs in accordance with the above equation in the event of α-dependent beam current distribution or energy dispersion. Generally, the charged particle beam apparatus requires a large current in order to increase its signal quantity or processing speed, and thus has to capture a wide range of charged particle beams emitted from a light source. That results in a wide distribution of orbit within a convergent lens, for which a trade-off is an increase in the amount of aberration, thus leading to a definition of performance in principle.

There have been proposals for methods for correcting the aberration. The methods include an aberration correction method that involves controlling the divergence and convergence of a multistage arrangement of regularly partitioned multipoles (see H. Rose, Nucl. Instrum. Meth. A 519, 12), and a multi-beam method that involves disposing a microlens array, splitting a charged particle beam into multiple beams, and performing orbit correction on the beams (see Japanese Patent Application Laid-Open Publication No. 2006-80155). Also included is a method that involves disposing a limiting aperture in ring zone form on the axis for the purposes of inhibiting aberration to some extent under a large current and also lessening the space-charge effect resulting from Coulomb repulsion or scattering particularly within a beam (see Japanese Patent Application Laid-Open Publication No. 2000-12454). An increase in the intensity of the charged particle beam raises also contributions made to space charge by electrons present on the axis, specifically a maximum intensity axis having a high current density. Thus, the concept of the above method is to use a doughnut-shaped aperture of axisymmetrical configuration and thereby increase the intensity of an electron source and hence an effective area for beam capture, rather than to capture the charged particle beam circularly about the axis. Discussions have been also made as to a method using an annular lens having an electrode disposed on the axis (see U.S. Pat. No. 3,100,260), as intended for a special electrooptic system.

SUMMARY OF THE INVENTION

A multipolar correction system or a lens array system is still applied only to some electron microscopes or an electron beam exposure system at the prototyping stage, because of requiring extremely highly accurate machining, disposition, power supply and adjusting method and thus having a great technical difficulty or cost disadvantage. Moreover, although a ring zone lighting method can be expected to reduce aberration by a given amount and also increase the amount of current, the method has the problem of insufficiently increasing the amount of current acquired particularly in a region not dominated by the space-charge effect, because of capturing an off-axis orbit limited by the aberration. Further, an annular lens method forms a very intense electric field on the axis, although being capable of achieving simple orbit correction to some extent. Due to this, the method has the drawback of being greatly affected by the influence of higher-order aberration. As mentioned above, a reduction in the amount of aberration is important in order to bring a charged particle beam into convergence, which has traditionally presented a problem.

An object of the present invention is to provide a low-cost, high-precision, high-resolution optical converging system for a charged particle beam by solving the problems inherent in a conventional aberration correction system for a rotationally symmetrical system.

The problem inherent in the conventional annular lens is solved as given below in order to perform aberration correction in the field of optics. As a result, a combination of positive and negative (or convex and concave) lenses possible with the annular lens is used to correct chromatic aberration or spherical aberration. In other words, the concept of this method is to use the positive and negative lenses and thereby cancel out the overall aberration coefficient. As opposed to this, an optical system for a charged particle beam, if it is a typical rotationally symmetrical system, is limited to forming the convex lens as mentioned above, and also has a finite quantity of aberration coefficient.

As opposed to these consequences, it can be seen that, when an electrode of an electric potential of the same sign as that of a charged particle beam is disposed on the axis, the electrode can produce a diverging action and thus form a negative lens action. In other words, it is possible that a nonlinear converging action outwardly augmented, typified by the spherical aberration of an electron lens, can be cancelled out by forming an appropriate orbit, by forming a distribution of electromagnetic field converging toward the center of a beam orbit axis and further by shaping the beam into a finite cross section.

Specifically, for an electric field, a microelectrode in needle or point form is disposed on the axis to apply a voltage, thereby enabling electrostatic focusing. For a magnetic field, a toroidal coil radially distributed-wound is formed in close proximity to the central axis, thereby enabling a magnetic flux density to converge toward the central axis under the influence of an angular divergence between the coils and a coil winding distribution. These actions can be utilized to cancel out aberration, thus virtually increase the range of radiation angles of a transmitted beam, and thus achieve a desired large current.

The concepts of these corrections are illustrated in FIGS. 1A to 1C and FIGS. 2A and 2B. FIG. 1A is a conceptual illustration of a conventional type of lens for a charged particle beam, and FIGS. 1B and 1C are conceptual illustrations of lenses each having an electrode disposed on the axis, showing a fundamental orbit under an applied voltage of the same sign as that of the charged particle beam, and a fundamental orbit under an applied voltage of a different sign from that of the charged particle beam, respectively. From FIGS. 1B and 1C, it can be seen that the lens acts on the charged particle beam as a positive or negative lens under the influence of the sign of an electrode potential and the polarity of a coil. FIGS. 2A and 2B show corrected orbits of a charged particle beam originating from a point on the axis and then reconverging to a point on the axis, which are formed by combinations of the fundamental orbits shown in FIGS. 1A to 1C. FIG. 2A shows an example of a combination of the conventional type of lens and a negative lens of axial type. FIG. 2B shows an example of a combination of positive and negative lenses of axial type. It can be seen that both of these combinations can bring the orbit into convergence to a point on the axis. The lenses are in any order. If the lenses are in reverse order, the orbits can be likewise in reverse order.

It is expected that the fundamental orbit of the conventional type of lens (see FIG. 1A) and the fundamental orbits of the axial type lenses (see FIGS. 1B and 1C) have the convergence of lines of electric force and hence greater beam deflection angles outside the axis and toward paraxial trajectories, respectively. To verify these fundamental orbits, the results of calculation of electron beam orbits using an electric field type corrector are shown in FIG. 3 and FIGS. 4A to 4C. As shown in FIG. 3, the electric field type corrector is formed of an axial electrode 2 for electrostatic focusing, and an off-axis electrode 3 for shaping an electric field. The axial electrode 2 has a cylindrical shape with a diameter of 0.1 mm and a length of 2 mm. The off-axis electrode 3 is an annular electrode of 1.5 mm thick, having a circular opening of 1.0 mm in diameter at the center. The axial electrode 2 is disposed on the central axis (or a rotation symmetry axis 4) of the off-axis electrode 3. In FIG. 3, there are shown plural electron orbits in a situation where a voltage Vout of 10 V is applied to the off-axis electrode 3, and electrons are inputted parallel to the rotation symmetry axis 4 under an accelerating voltage Vo of 5000 V. As expected, it can be seen that curvature (or deflection sensitivity) is greater toward the paraxial trajectory.

FIGS. 4A to 4C are plots showing the results of calculation of the displacement $\Delta r$ of an electron beam 1 on a sample surface 5 perpendicular to the rotation symmetry axis 4, using a distance r from the central axis in the arrangement shown in FIG. 3 as a parameter. FIG. 4A shows a result of calculation performed on the conventional type of lens for comparison under a condition where the lens is not provided with the axial electrode 2 at the center. FIG. 4B shows a result of calculation performed on the lens provided with the axial electrode 2 under a condition where a negative voltage is applied to the axial electrode 2. FIG. 4C shows a result of calculation performed on the lens with the axial electrode 2 under a condition where a positive voltage is applied to the axial electrode 2. As is apparent from FIG. 4A, the conventional type of lens imparts greater deflection to the electron beam farther away from the central axis. As opposed to this, it can be seen from FIGS. 4B and 4C that the lens provided with the axial electrode 2 imparts greater deflection to the electron beam 1 nearer to the central axis under the influence of electrostatic focusing. Moreover, comparison of the orbits shows that the axial type lens can form a diverging or converging orbit (or the concave or convex lens) with order-of-magnitude higher sensitivity under the influence of the polarity of the applied voltage, as compared to the conventional type of lens. In other words, it can be seen that the electric field type corrector shown in FIG. 3 tends to have a great deflecting action on the paraxial trajectories both under diverging conditions and under converging conditions, as predicted from FIGS. 1A to 1C.

FIGS. 5A and 5B show examples of orbits of incoming parallel rays of beams, which are likewise compared under conditions where electrodes are of adjusted shapes. Specifically, FIG. 5A shows an instance where an off-axis electrode having a cylindrical shape is used, and FIG. 5B shows an instance where an off-axis electrode having a conical shape, which is formed of the cylindrical off-axis electrode with the bottom end open, is used. In any of these instances, there are given examples of calculations in a situation where the axial electrode is 60 mm in length and is at a ground potential, the off-axis electrode is 40 mm in length and is subjected to a voltage Vb of 500 V, and incoming electrons are inputted parallel to the rotation symmetry axis 4 under an accelerating voltage Vo of 10 kV. Consequently, it can be seen that the off-axis electrode having the conical shape does not effect much change in a deflection position on the surface of the sample, although lowering a converging point as compared to the off-axis electrode having the cylindrical shape. From this result, it can be said that the lens action is sensitive to the shape of the axial electrode in which electrostatic focusing is to be encountered, and the distance between the beam orbits. It can be therefore seen that a needle electrode can be disposed on the axis in order to attain a high-sensitivity lens action. A cylindrical electrode having a large electrode diameter or a point electrode can be disposed on the axis in order to suppress unwanted sensitivity.

However, the needle electrode or the long cylindrical electrode increases the likelihood of higher-order aberration occurring depending on a divergent angle of an incoming beam, because of producing a very intense electric field on the axis and in its vicinity as shown in FIGS. 4A to 4C. As opposed to this, the point electrode, although increasing also electrostatic focusing, can reduce aberration, provided that admitted beam orbits are limited, that a support is grounded and sealed, or that plural point electrodes are installed. Further, the corrector may be specifically configured to be provided with an aperture in ring zone form and thereby input and control a beam within an appropriate range of deflecting action distribution shown in FIGS. 4A to 4C.

The corrector according to the present invention as mentioned above, when used singly or in combination, can be applied to the cancellation of electro-optical aberration, and further to the adjustment of setting of conditions of entrance into a detector and the separation of signals by promoting the convergence and divergence of electrons drawn from the surface of a sample.

Recently, advances in processing technology such as MEMS (Micro-Electro-Mechanical Systems) have enabled microfabrication of an electron source and an electron lens. According to an electro-optical similarity principle, it is known that the electric field type can obtain the same beam orbit when a voltage and an electrode are equally scaled down. Accordingly, the ability to fabricate an electrode of the order of a few tens of micrometers (μm) by use of these microfabrication technologies makes it possible to perform beam orbit control under a low-voltage power supply merely by the replacement of a conventional limiting aperture by the corrector of the present invention.

Consequently, the present invention can provide an aberration correction method having a high degree of general versatility, extremely compactly, at low cost, with a power supply included therein.

BRIEF DESCRIPTION OF THE DRAWINGS

FIGS. 5A and 5B are illustrations showing the relation between the shape of an off-axis electrode and a change in orbit.

DETAILED DESCRIPTION OF THE PREFERRED EMBODIMENTS

Embodiments of the present invention will be described below. Although description will hereinafter be given with regard to an instance where an electron is used as a charged particle, a corrector of the present invention may be applied to an instance where an ion is used as the charged particle.

FIGS. 6A and 6B and FIGS. 7A and 7B show examples of electric field type correctors having axial electrodes formed of a needle electrode type and a point electrode type, respectively.

Figure 6A:
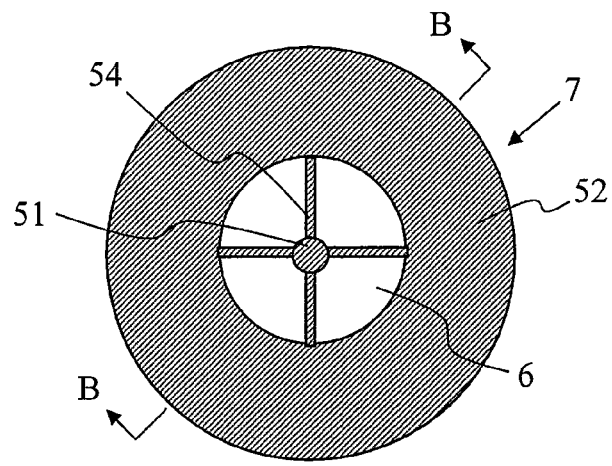
FIGS. 6A and 6B are views showing an example of an electric field type corrector having an axial electrode in needle form.
Figure 6B:
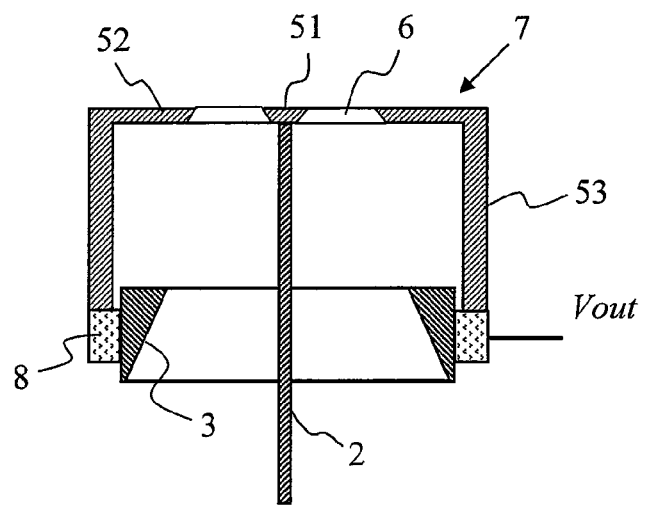

FIGS. 6A and 6B are views showing an example of the prior-art electric field type corrector having the axial electrode in needle form. FIG. 6A is a plan view, and FIG. 6B is a cross-sectional view taken along the line B-B of FIG. 6A. In the example of the prior-art electric field type corrector, an axial electrode 2 is disposed as suspended by a support 7 along the central axis of an off-axis electrode 3. The off-axis electrode 3 is externally fixed by the support 7, and a voltage Vout can be applied to the off-axis electrode 3. Since action on a charged particle beam is produced by a line of electric force across the axial electrode 2 and the off-axis electrode 3, the voltage Vout can be applied to the off-axis electrode 3 with the axial electrode 2 at a ground potential. The support 7 that fixes the axial electrode 2 and the off-axis electrode 3 is made of an electrical conductor in order to prevent electrification. The support 7 is formed of an upper section 52 having, at the center, an axial electrode fixing unit 51 that fixes one end of the axial electrode 2, and a cylindrical section 53 on the side, extending from an outer periphery of the upper section 52 in such a manner as to surround the axial electrode 2. A ring zone aperture 6 is formed around the axial electrode fixing unit 51 of the upper section 52, and the axial electrode fixing unit 51 is fixed to the body of the support 7 by a thin beam 54 extending across the ring zone aperture 6. The off-axis electrode 3 is fixed to the cylindrical section 53 of the support 7 with an insulator 8 in between.

Figure 7A:
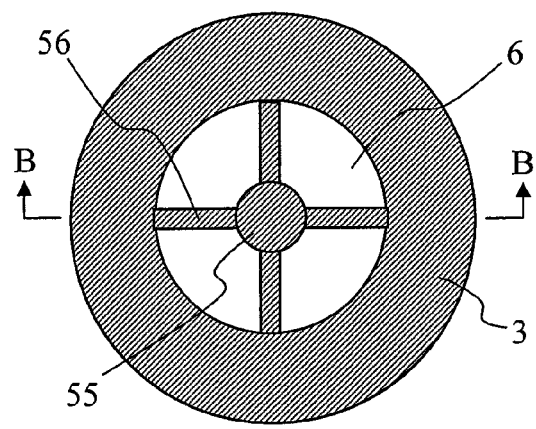
FIGS. 7A and 7B are views showing an example of an electric field type corrector having an axial electrode in point form.
Figure 7B:
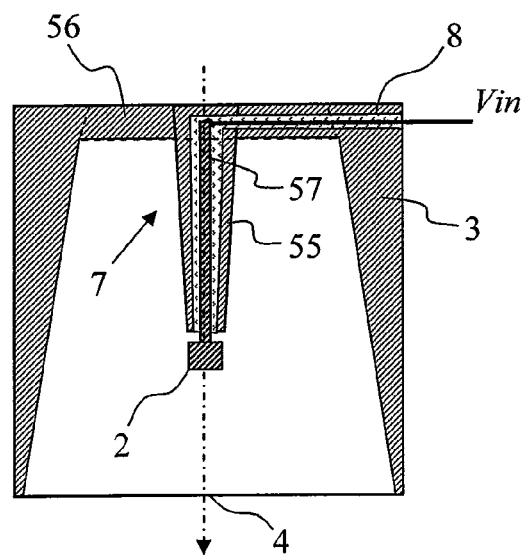

FIGS. 7A and 7B show the electric field type corrector having the axial electrode in point form according to the embodiment of the present invention. FIG. 7A is a plan view, and FIG. 7B is a cross-sectional view taken along the line B-B of FIG. 7A. The electric field type corrector according to the embodiment includes the axial electrode 2 in point form, and the off-axis electrode 3 having a cylindrical shape, surrounding the axial electrode 2. An inner surface of the off-axis electrode 3 forms a part of a conic surface of a cone whose diameter becomes larger in a direction of from the upstream part to the downstream part of the charged particle beam. An angle of the conic surface can be changed to change a converging action as shown in FIGS. 5A and 5B. The support 7 that fixes the axial electrode 2 and the off-axis electrode 3 is formed of a column 55 that holds the axial electrode 2 at the tip, and plural thin beams 56 that fix the tail end of the column 55 to the upstream end of the off-axis electrode 3. Consequently, the ring zone aperture 6 is formed around the column 55 that holds the axial electrode 2. A power feeder 57 that feeds power to the axial electrode 2 is connected to the axial electrode 2 through the beams 56 and the column 55 of the support 7. The axial electrode 2 is electrically insulated from the support 7 and the off-axis electrode 3 by the insulator 8. The support 7 is made of the electrical conductor in order to prevent electrification. A voltage Vin is applied to the axial electrode 2 with the support 7 and the off-axis electrode 3 at the ground potential, in order that an electric field converges to the axial electrode 2 in point form located at the tip of the column 55.

To actually make selective use of the axial electrode in needle form and the axial electrode in point form, the voltage Vout is exerted on a combination of the off-axis electrode shown in FIGS. 6A and 6B and the axial electrode shown in FIGS. 7A and 7B with the voltage Vin at the ground potential to thereby allow selection between the axial electrodes. The ring zone aperture 6 limits the entrance of the beam into the electric field type corrector to a desired correction range. The configurations shown in FIGS. 6A and 6B and FIGS. 7A and 7B may have multilayer interconnection or the like to form a multielectrode arrangement.

Figure 8:
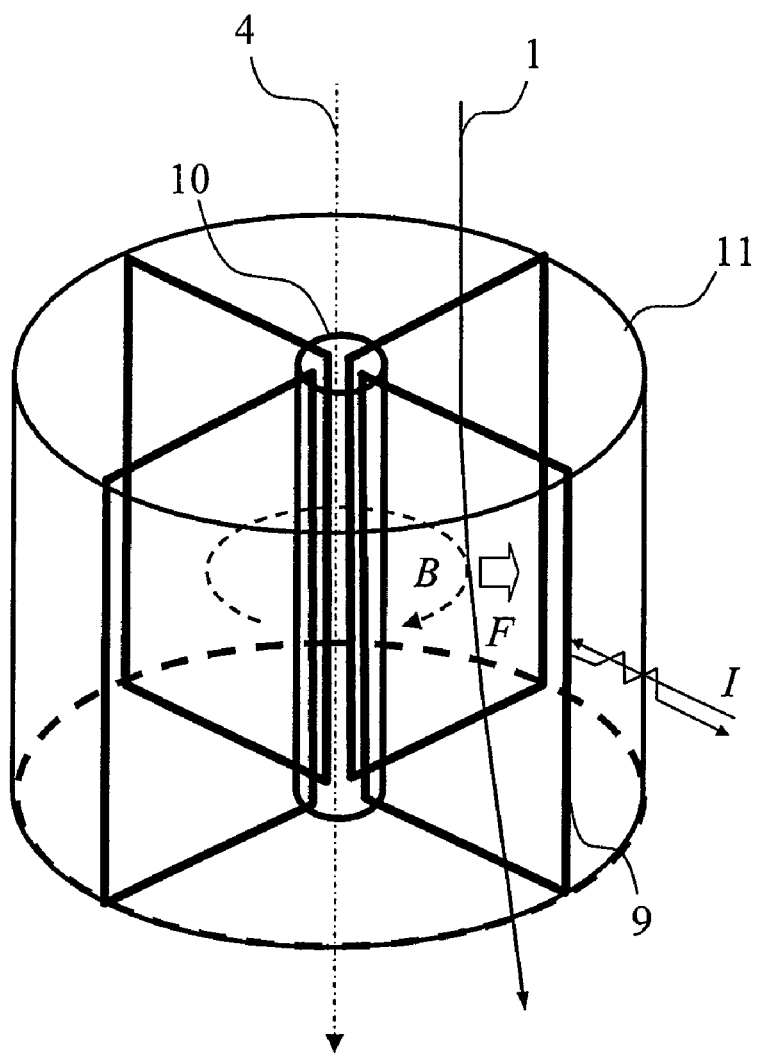
FIG. 8 is a schematic view showing an example of a magnetic field type corrector.

FIG. 8 is a schematic view showing an example of a magnetic field type corrector. In the illustrated instance, the magnetic field type corrector is formed of a coil 9 wound, in a toroidal fashion, radially about a rotation symmetry axis 4, and a rotating magnetic field B is produced under a current I. The magnetic field B radially exerts Lorentz force F on a charged particle beam 1 entering the corrector from above, and develops a converging or diverging action under the influence of the direction of the force. Although shown as simplified in order to make the inside of the corrector visible, an inner cylinder 10 and an outer cylinder 11 are disposed in order to support the coil 9 and to shield the beam as in the case of the correctors shown in FIGS. 6A and 6B and FIGS. 7A and 7B. The charged particle beam 1 enters into a doughnut-shaped region between the inner cylinder 10 and the outer cylinder 11. Although shown as separated, the coil 9 can be continuously wound to reduce the number of power supply units. An electrically conductive film, as needed, is formed on the insulator or the surface of an insulating layer of coil wiring, which can possibly affect the charged particle beam by undergoing electrification.

With the above configuration, interconnection technology for a magnetic head device or a semiconductor device can be used for microfabrication of metal interconnection or a distributed-wound coil. For the latter, a power supply circuit may be formed in close proximity to the corrector by use of microfabrication technology. Specific examples of orbit corrections according the present invention will be given below.

Figure 9:
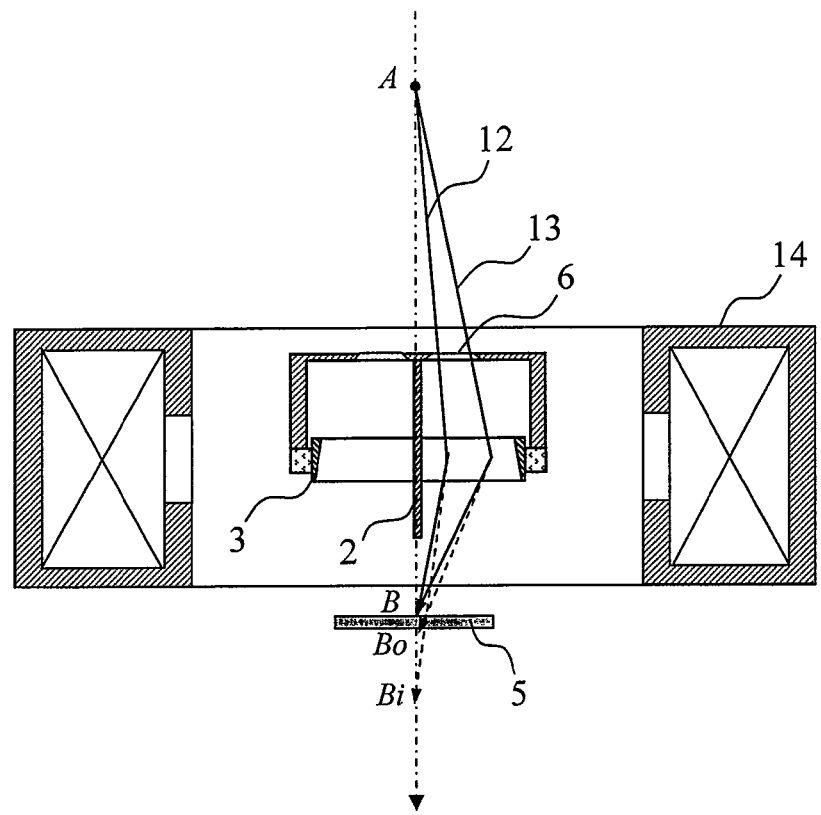
FIG. 9 is a view showing an example of spherical aberration correction under converging conditions.

FIG. 9 shows an example of the electric field type corrector of the present invention as applied to an electromagnetic lens. The electric field type corrector has a construction shown in FIGS. 6A and 6B, including the axial electrode 2 and the off-axis electrode 3. A beam originating from an object point A is focused through an objective lens 14 to an image point B on a sample surface 5. Discussion is herein made, assuming, for the sake of convenience, that the beam is divided into a paraxial trajectory 12 in close proximity to the axis and an off-axis trajectory 13 distant from the axis. With the use of the objective lens 14 alone, under the influence of spherical aberration, the off-axis trajectory 13 undergoes a stronger converging action, as compared to the paraxial trajectory 12 The trajectories 12 and 13 intersect the axis at points Bi and Bo, respectively, as shown by the dashed lines in FIG. 9. Due to this, the beam has a finite beam radius on the sample surface 5.

As shown in FIG. 9, the points Bi and Bo can be shifted to the desired point B by superposing converging actions on beam paths by using the electric field type corrector as an auxiliary under converging conditions where the electric field type corrector is disposed on an orbit including the objective lens 14, and the axial electrode 2 is set at a positive potential with respect to the off-axis electrode 3. At this point, an electromagnetic lens action and the amount of converging action of the electric field type corrector are strictly continuous functions of different converging angles α. When the voltage of the electric field type corrector and the shape of the electrode thereof are adjusted to bring the innermost and outermost points within the range limited by the ring zone aperture 6 into convergence, a substantial reduction in aberration can be expected from characteristics of the continuous functions.

The ability to achieve the corrector of minute size by means of microfabrication enables the replacement of a limiting aperture by the corrector. Generally, the disposition of the electrode within the electromagnetic lens leads to a magnetic field action becoming modulated under acceleration or deceleration. However, size reduction enables the influence of modulation to become negligibly weak. Under these conditions, the behavior of the orbit can be estimated to be the added degrees of influences.

With a typical electron lens system, energy dispersion of incoming electrons results in chromatic aberration, that is, a difference in converging sensitivity, and hence an increase in beam defocusing. For example, a general electron lens has high energy and a small converging angle, and thus has a chromatic aberration coefficient, or equivalently the sensitivity of the lens, having a negative value. As opposed to this, the electric field type corrector changes the direction of deflection according to diverging or converging conditions. A system including the electric field type corrector thus has a chromatic aberration coefficient that can likewise take on positive and negative values in principle. Also in the example shown in FIG. 9, the electric field type corrector can act as a diverging lens to superpose its action on a magnetic field of the objective lens 14 and thereby correct a change in orbit caused by an energy differential between the lenses. However, it is clear that, in the instance shown in FIG. 9, when the electric field type corrector is set under the diverging conditions, the paraxial trajectory 12 is focused into an image at a lower point, resulting in an increase in spherical aberration. Generally, in the field of optics, correction for aberration including chromatic aberration requires a combination of concave and convex lenses.

Figure 1A:
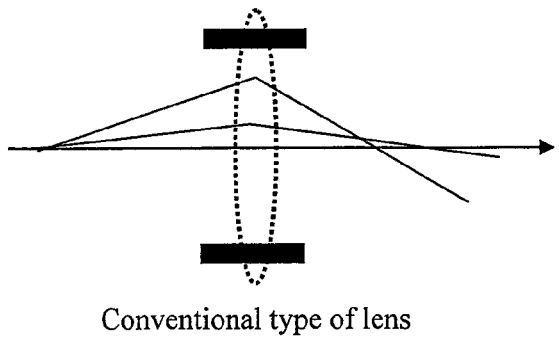
FIGS. 1A to 1C are conceptual illustrations showing the relation between the dispositions of electrodes and lens actions.
Figure 1B:
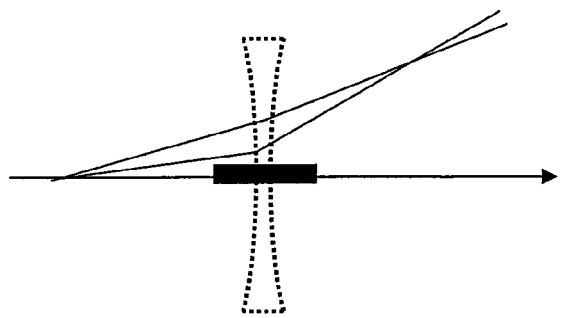
Figure 1C:
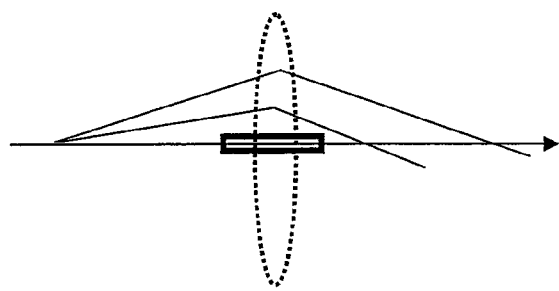
Figure 2A:
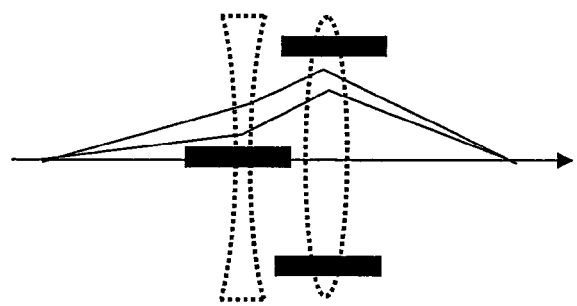
FIGS. 2A and 2B are conceptual illustrations of orbit corrections using combinations of the electrodes.
Figure 2B:
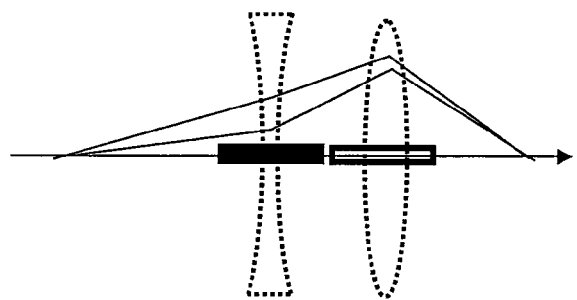
Figure 3:
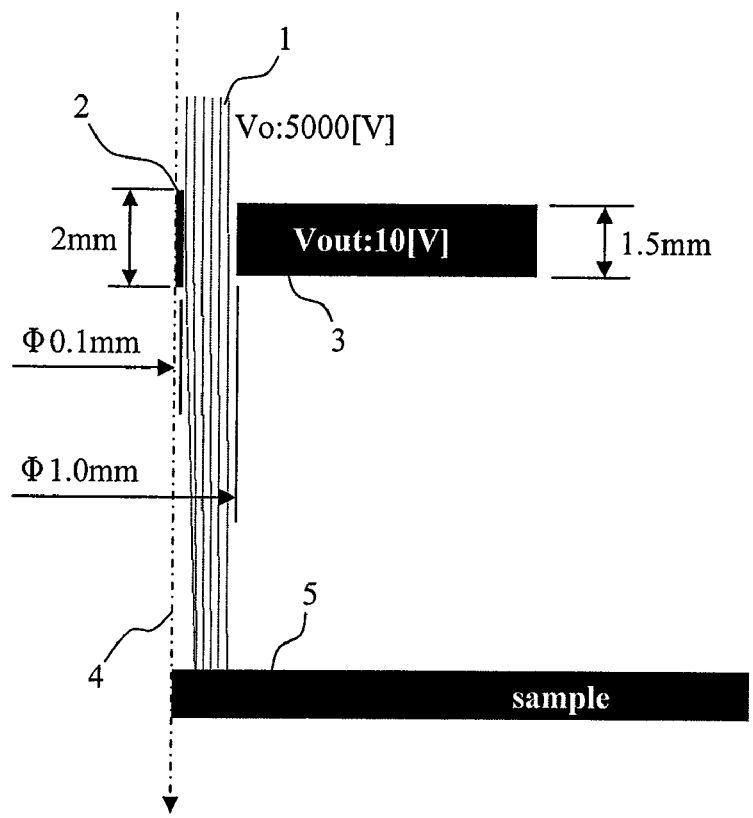
FIG. 3 is an illustration of the dispositions of the electrodes for calculation for verifying principles.
Figure 10:
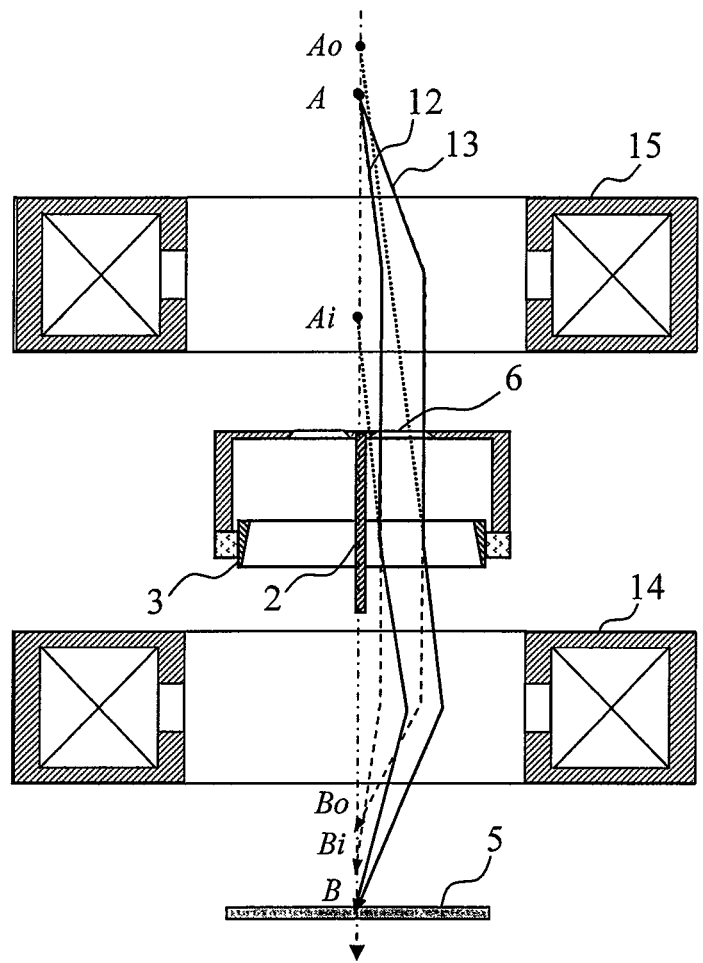
FIG. 10 is a view showing an example of chromatic and spherical aberration correction under diverging conditions.

Based on the above discussion, FIG. 10 shows an example of the electric field type corrector as applied to a three-stage combined lens system and used under the diverging conditions in order to simultaneously reduce both the spherical aberration and the chromatic aberration. An entrance lens 15 adjusts an angle of entry of an electron beam originating from the object point A into the ring zone aperture 6 of the electric field type corrector including the axial electrode 2 and the off-axis electrode 3. In FIG. 10, the beam is shown as entering substantially parallel to the ring zone aperture 6, in order that it can be readily seen. The paraxial trajectory 12 and the off-axis trajectory 13 are set in a diverging direction by the axial electrode 2 and the off-axis electrode 3 to thereby form such trajectories as originated from points Ai and Ao, respectively, as viewed from the objective lens 14. According to a lens formula, therefore, the paraxial trajectory 12 and the off-axis trajectory 13 are shifted toward the lens and away from the lens, respectively, on the imaging part of the objective lens, and the trajectories 12 and 13 exhibit a tendency opposite to the spherical aberration, so that they can converge to the point B. The diverging action of the corrector and the converging action of the objective lens 14 can be utilized to cancel out the chromatic aberration. As shown in FIGS. 2A and 2B, a plural-stage corrector including the entrance lens 15 and the objective lens 14 may be arranged for use in orbit correction, in place of the above corrector.

Figure 11:
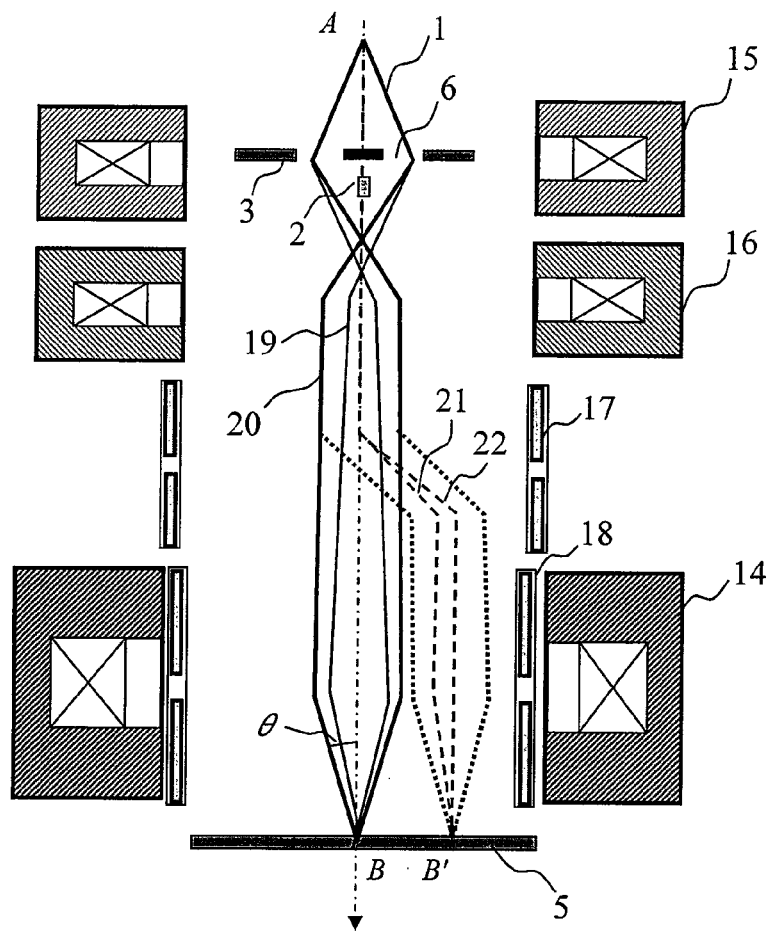
FIG. 11 is a view showing an example of application to an off-axis correction system.

FIG. 11 is a schematic view showing an example of an electron microscope including the electric field type corrector of the present invention as used in combination with a deflection aberration correction system. Known as a method for correcting deflection aberration is MOL (Moving Objective Lens) method that involves apparently bringing a lens axis into convergence with a deflection position by superposing a transverse magnetic field on a lens magnetic field. (See J. Vac. Sci. Technol. B20(6) November/December 2002.) In FIG. 11, the beam 1 originating from the object point A enters the entrance lens 15, as being limited in ring zone form. The incoming beam 1 is split into a high-energy paraxial trajectory 19 and a low-energy paraxial trajectory 20 according to energy of electric fields under the influence of the electric fields of the axial electrode 2 and the off-axis electrode 3.

In the example shown in FIG. 11, the trajectories cross each other in a stage preceding a projection lens 16, as distinct from the example shown in FIG. 10. When, under this condition, the high-energy paraxial trajectory 19 is shifted through the projection lens 16 inwardly from the low-energy paraxial trajectory 20 and substantially parallel to the rotation symmetry axis 4, an object point of the objective lens 14 also becomes substantially a point at infinity and provides convergence to a point on the sample surface 5. Correction of chromatic aberration is hence achieved. The paraxial trajectory is focused through the objective lens 14 onto the sample surface 5 at a tilt angle θ. The tilt angle θ is adjusted under control of the axial electrode 2 or the off-axis electrode 3 so as to cancel out spherical aberration of the objective lens 14 and thus provide convergence to the point B, thereby minimizing the overall axial aberration.

In FIG. 11, the beam deflected by a two-stage deflector 17 enters the objective lens 14 perpendicularly, and further, a transverse magnetic field corrector 18 cancels out off-axis transverse magnetic field components of the objective lens 14 to thereby correct off-axis aberration or equivalently deflection aberration. In this case, for deflection chromatic aberration, the projection lens 16 can form parallel beams to thereby bring a high-energy deflected trajectory 21 and a low-energy deflected trajectory 22 into convergence to a point B' on the sample surface 5.

The corrector of the present invention has an extremely high degree of general versatility, because of being capable of replacing a conventional aberration corrector or limiting aperture for a scanning electron microscope and a transmission electron microscope, based on the as-is concepts thereof. Moreover, the corrector of the present invention is easily mounted to a multi-beam system or the like that has recently drawn attention, because of having the feature of having a simple construction and thus facilitating microfabrication.

Figure 4A:
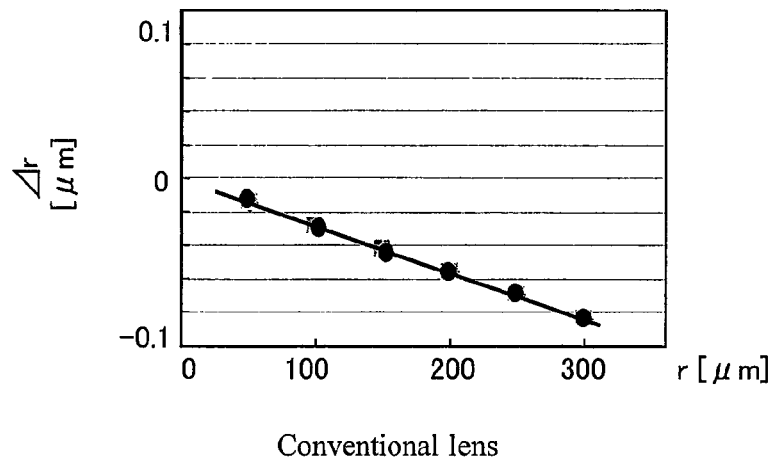
FIGS. 4A to 4C are plots showing the results of calculation of orbit departure.
Figure 4B:
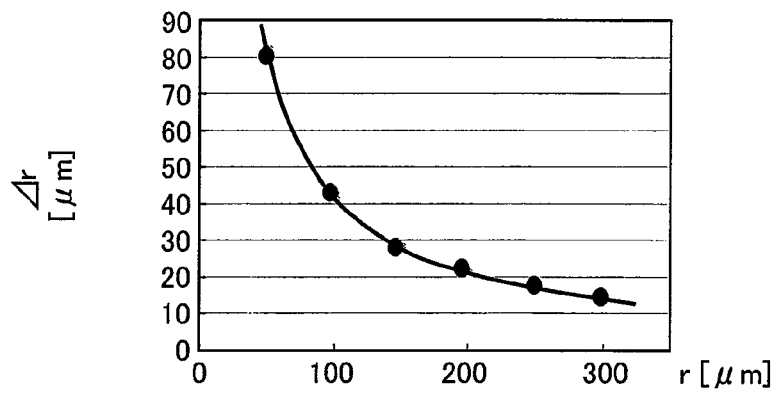
Figure 4C:
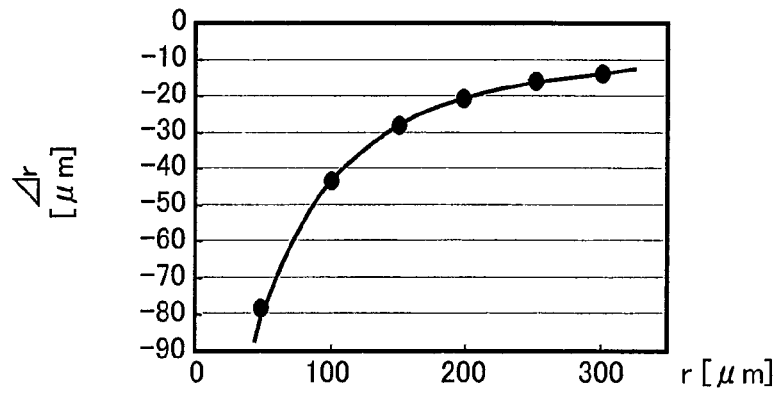
Figure 12:
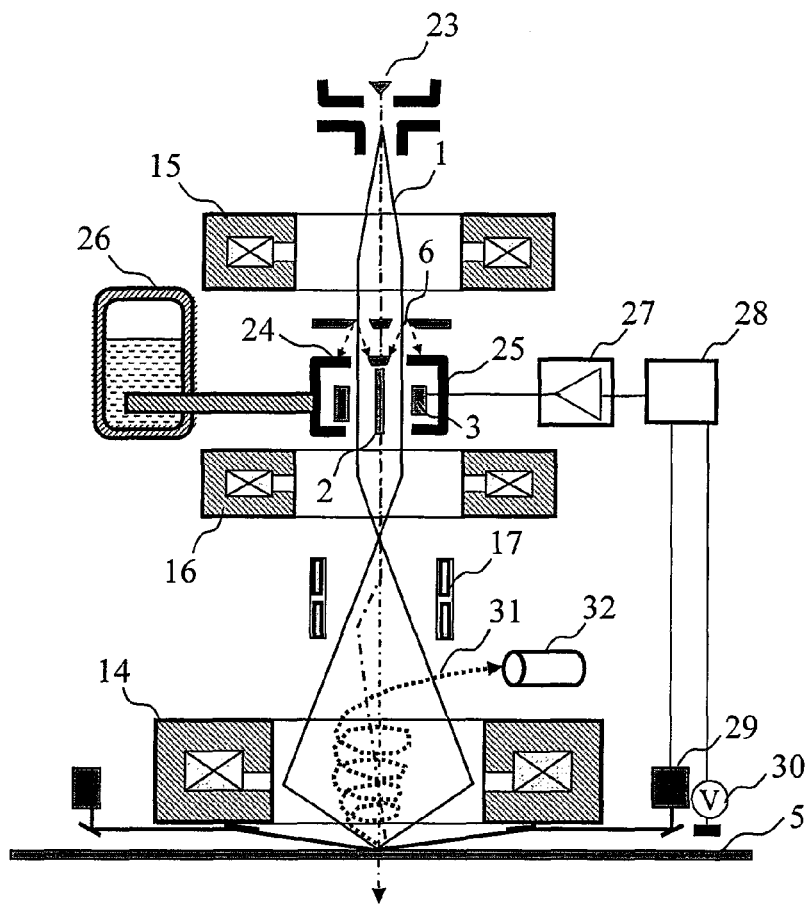
FIG. 12 is a view showing an example of application to a scanning electron microscope.

FIG. 12 is a schematic view showing an example of a scanning electron microscope (SEM) having the corrector of the present invention built-in. The electron beam 1 emitted from an electron source 23 undergoes orbit formation through the entrance lens 15, enters the electric field type corrector including the axial electrode 2 and the off-axis electrode 3, and is focused through the projection lens 16 into an image at the object point of the objective lens 14. Further, the electron beam 1 is focused through the objective lens 14 into an image on the sample surface 5, and the sample surface 5 is scanned in two dimensions by the scanning deflector 17. A detector 32 traps signal electrons 31 such as secondary electrons emitted from the sample to thereby obtain scan image information. At this point, the axial electrode 2 and the off-axis electrode 3 of the electric field type corrector have high deflection sensitivity as shown in FIGS. 4A to 4C, and are susceptible to the influence of electrification such as contamination due to being in the vicinity of the beam 1. Although the configuration of the electric field type corrector shown in FIG. 12 is the same as shown in FIG. 10, there are provided measures against the contamination and the influence of disturbance for purposes of stabilization. Specifically, a shield 25 is disposed on or around the corrector. When the shield 25 is made of a magnetic material, the shield 25 can prevent the influence of an external electromagnetic field. When the shield 25 acts as a cold trap by being cooled by a cooling device 26, the shield 25 is effective in reducing the contamination. Contamination encountered in an electron beam apparatus is proportional to the number of incoming electrons including scattered electrons to a correction electrode unit, besides the degree of vacuum. For this reason, in the example shown in FIG. 12, the corrector is further provided with the ring zone aperture 6 disposed in its upper portion, so that the corrector has a double-aperture construction formed of the ring zone aperture 6 and a limiting aperture 24 that prevents the entry of scattered electrons by the shield 25 or the support. Moreover, a driving circuit 27 may be used to apply a negative offset voltage to the corrector or the shield 25 and thereby prevent the entry of electrons. Further, the shield 25 may be made of an electrically conductive material to reduce an external leakage electric field produced by the electric field type corrector and thereby prevent the occurrence of unwanted astigmatism or the like.

In a SEM type semiconductor wafer tester requiring high-speed image pickup, a height sensor 29 and a surface potential electrometer 30 measure the height of the surface of a wafer and electrification information on the surface thereof, respectively, to automatically correct an exciting current for the objective lens 14. In the SEM shown in FIG. 12, a correction calculation circuit 28 adds an appropriate correction value to an output from the driving circuit 27, based on the obtained wafer information. In other words, a correction voltage can be applied to the axial electrode 2 or the off-axis electrode 3 capable of high-sensitivity, high-speed operation to achieve a further speedup. For example, if the height of the surface of the wafer is great, an applied voltage to the off-axis electrode 3 is corrected to negative to raise a focal point. If the wafer is positively charged and has the diverging action, the applied voltage to the off-axis electrode 3 is likewise corrected to negative to raise the focal point.

Figure 13:
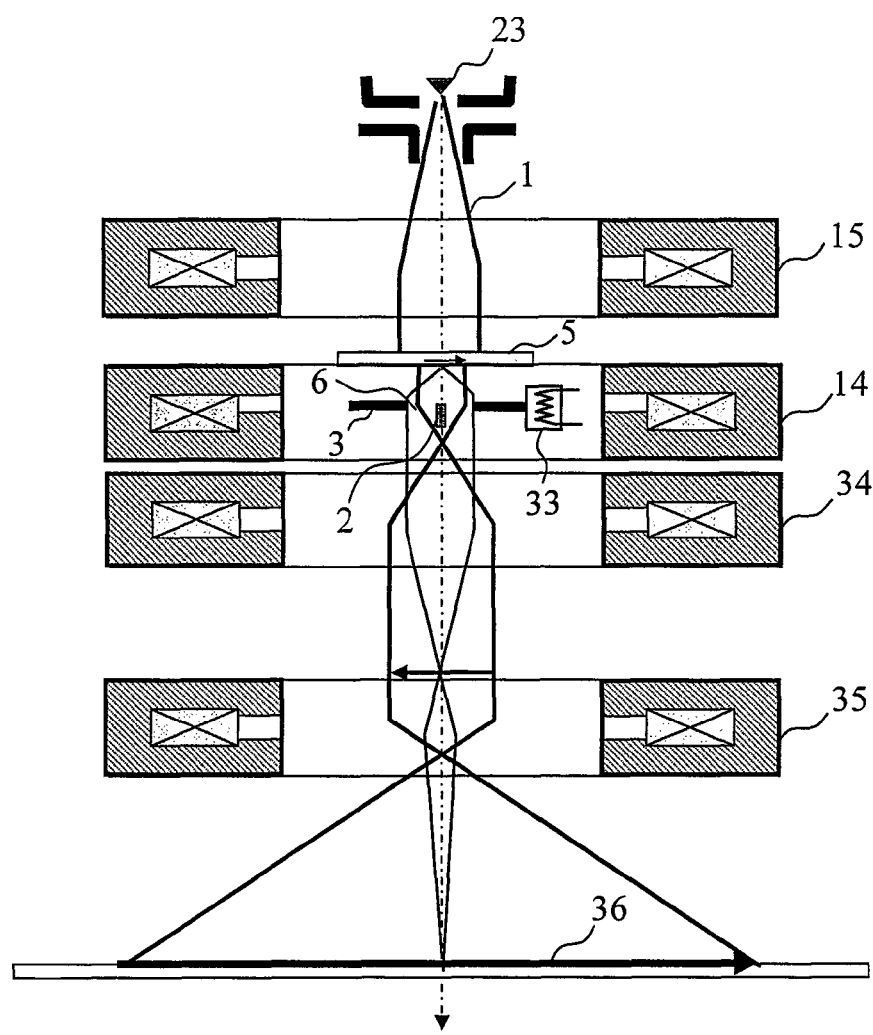
FIG. 13 is a view showing an example of application to a transmission electron microscope.

FIG. 13 is a schematic view showing an example of a transmission electron microscope having the corrector of the present invention built-in. After having been emitted from the electron source 23 and then applied through the entrance lens 15 to the sample 5, electrons undergo orbit formation and energy loss by interaction with a substance in the sample and are focused through the objective lens 14 into the electric field type corrector including the axial electrode 2 and the off-axis electrode 3. At this point, electrons having desired scattering information are selected by the ring zone aperture 6 or an additionally inserted limiting aperture and are focused through a magnifying lens 35 into an image on a projection plane 36. For normal usage, it is necessary to form a sharp image on the projection plane 36 with the sample 5 acting as an object point, and thus, spherical aberration correction is important. For the transmission electron microscope shown in FIG. 13, therefore, a negative potential can be placed within the ring zone aperture 6, and the form of the correction shown in FIG. 9 may be applied to the microscope shown in FIG. 13. To dispose the corrector in place of the limiting aperture, the approach of disposing the corrector on a lens principal plane having good beam orbit spread controllability or a coma-free plane on which aberration due to axis misalignment is the minimum can possibly be adopted. Moreover, a conventional limiting aperture fine-adjustment mechanism and the like may be used as it is. Further, to correct also chromatic aberration, the three-stage lens system including one or more correctors is disposed as shown by the example of FIG. 10, and an orbit is adjusted by the objective lens 14 and an intermediate lens 34.

In the example shown in FIG. 13, an approach for stabilization is to provide a support for the ring zone aperture 6, formed of a heater 33 for reducing the occurrence of contamination by moderate heating, and a heating mechanism for the axial electrode 2 or the off-axis electrode 3. The compact form of the correction as shown in FIG. 13 facilitates heating, enables a reduction in the overall length of an optical system as compared to a conventional multistage multipolar correction system, and resists the influence of disturbance. Further, a magnetic field shield or the like is easily disposed around the corrector, and moreover, vibration resistance and noise immunity are excellent. An optical scanning system shown in FIG. 12 may be mounted, as it is, as an irradiation system also to a scanning transmission electron microscope (STEM).

Figure 14:
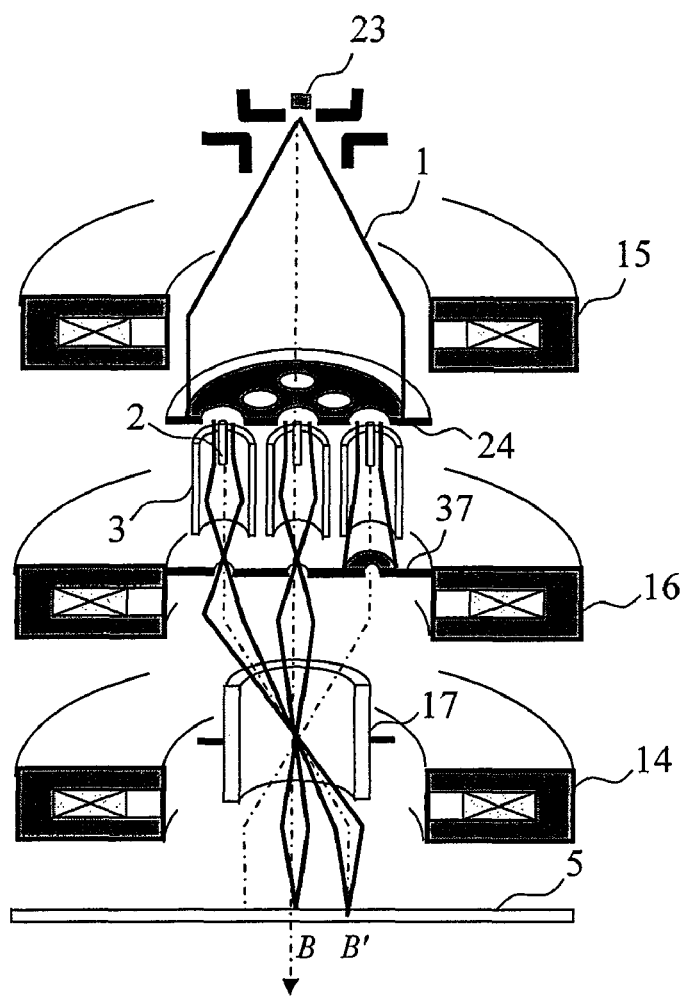
FIG. 14 is a view showing an example of application to a multi-beam optical system.

FIG. 14 is a schematic view showing an example of a multi-beam optical system having the corrector of the present invention built-in. The charged particle beam 1 emitted from the electron source 23 is controlled by the entrance lens 15 so that the incoming beam entering the limiting aperture 24 having many apertures forms parallel orbits under normal conditions. A lens array under the limiting aperture 24 is an assembly of the fine axial electrodes 2 and off-axis electrodes 3, and brings the beam into convergence to allow the beam to pass through a blanking aperture 37. Specifically, at this point, the set voltage of the axial electrode 2 or the off-axis electrode 3 can be individually changed to change converging conditions for individual lenses in the lens array and thereby change a current to be passed through the blanking aperture 37. Only electrons that have passed through the blanking aperture 37 are focused through the projection lens 16 and are focused through the objective lens 14 into an image on the sample surface 5. At this point, the beam deflector 17 can subject the sample surface 5 to electron beam exposure or irradiation in any given pattern by repeating blanking operation while doing two-dimensional scanning by a pitch BB' of multi-beams. At this point, the voltage of the axial electrode 2 or the off-axis electrode 3 is controlled according to the arranged positions of the lenses or an output from the deflector 17. Consequently, this enables chromatic aberration and spherical aberration corrections on the individual multi-beams as shown in FIG. 10, besides deflection aberration correction on the objective lens 14.

Figure 15:
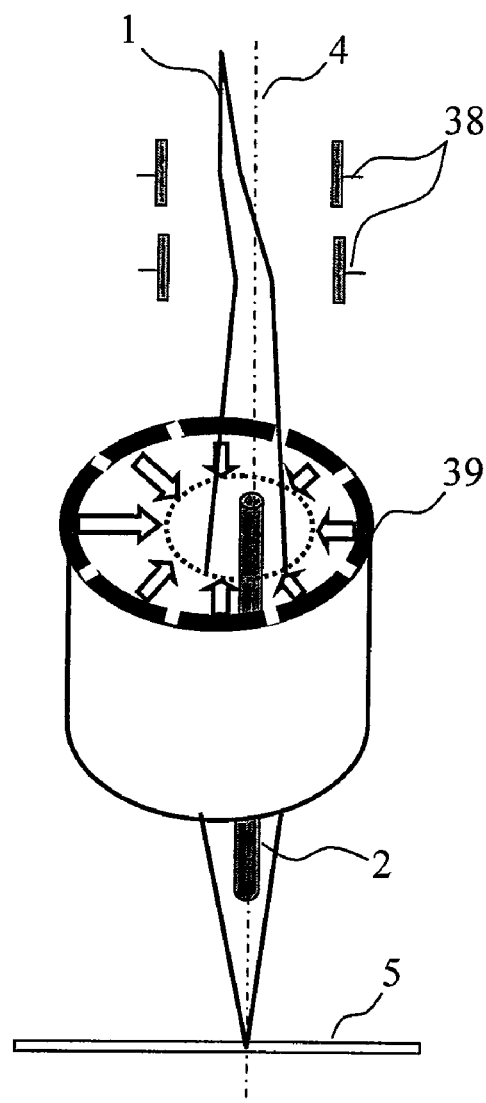
FIG. 15 is an illustration of assistance in explaining an axis misalignment correction method.

For these practical applications, it is important to correct a disposition error of the axial electrode and the direction of entrance of the beam. As shown in FIG. 15, an electrical aligner coil 38 and fine-adjustment mechanism can be used to adjust entrance conditions for the beam, but it is difficult to externally correct the axis misalignment of the axial electrode 2 with respect to the off-axis electrode 3. It is therefore desirable that the corrector have its own correcting function. The electric field type corrector shown in FIG. 15 is an example of the corrector using an octupole 39 as the off-axis electrode in order to achieve the correcting function. An octupole deflecting voltage can be added to a voltage to be originally set, to shift the symmetry axis of the off-axis electrode 3 and thereby bring the axis into convergence with the axial electrode 2.

Figure 16:
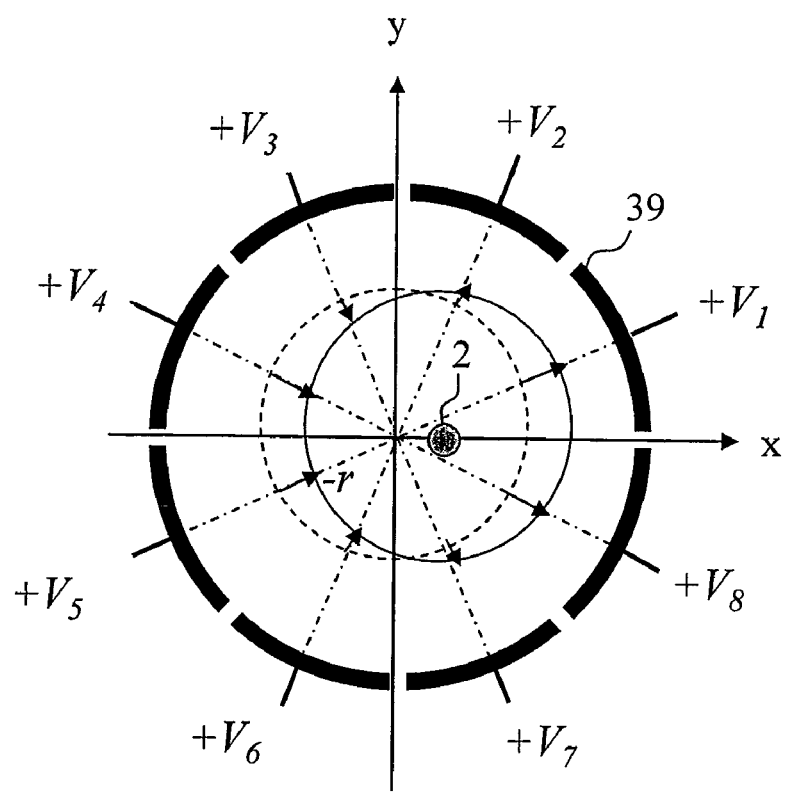
FIG. 16 is a view showing an example of correction using an octupole.

FIG. 16 is a top view of the electric field type corrector using the multipolar electrode 39 as the off-axis electrode. A voltage application method for axis misalignment correction will be described with reference to FIG. 16. A circular equipotential surface formed by a voltage Vn isotropically applied to the octupole 39 (Vn=Vout, where n=1, 2, 3, ..., 8) is shown by the dashed lines in FIG. 16. At this point, the voltage Vn can be adjusted so that the equipotential surface shown by the dashed lines is shifted to a circular equipotential surface shown by the solid line in FIG. 16, the axis of which coincides with the axial electrode 2 misaligned in the direction of the X axis. As is apparent from symmetry shown in FIG. 16, a correction voltage Vx that satisfies Equation (2) can be added.

$$V_1=V_8=Vx,\ V_2=V_7=aVx,\ V_3=V_6=-aVx,\ V_4=V_5=-Vx \quad (2)$$

With a correction factor a, however, the correction voltage Vx depends also on the shape of the electrode. FIG. 16 shows the correction of axis misalignment in the direction of the X axis. In general cases where axis misalignment occurs also in the direction of the Y axis, the relationship expressed by Equation (2) in which Vy is substituted for Vx can be rotated 90 degrees for addition. Moreover, voltages Vs and Vt alternately reversed as expressed by Equation (3) can be added to correct astigmatism occurring under some influence.

$$V_1=V_5=Vs,\ V_3=V_7=-Vs,\ V_2=V_6=Vt,\ V_4=V_8=-Vt \quad (3)$$

A magnetic field type coil having an octupole arrangement may be used for correction. In other cases, a further multipolar arrangement can be used to correct higher-order astigmatism.

Figure 17:
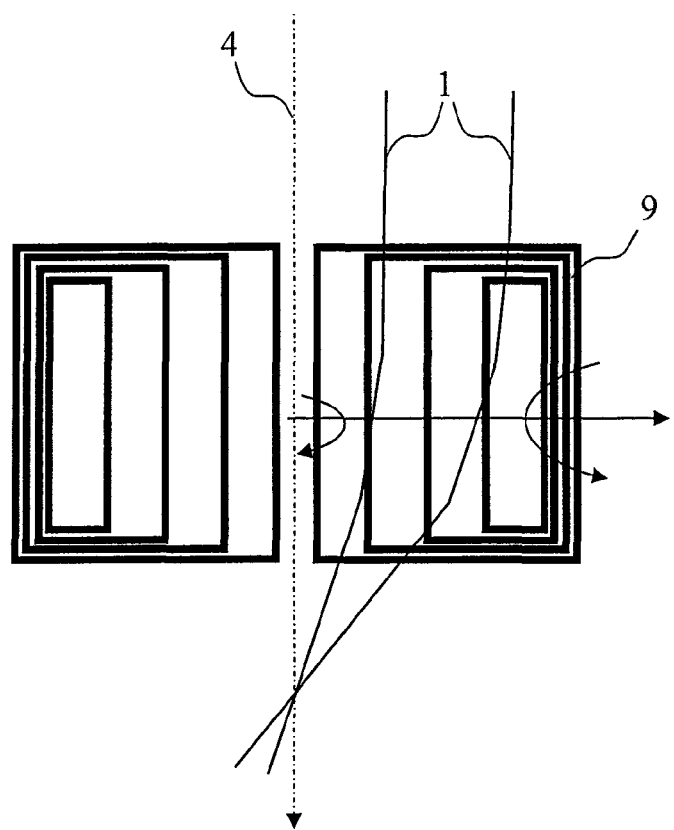
FIG. 17 is an illustration of assistance in explaining an orbit correction method using a distributed-wound coil.
Figure 18:
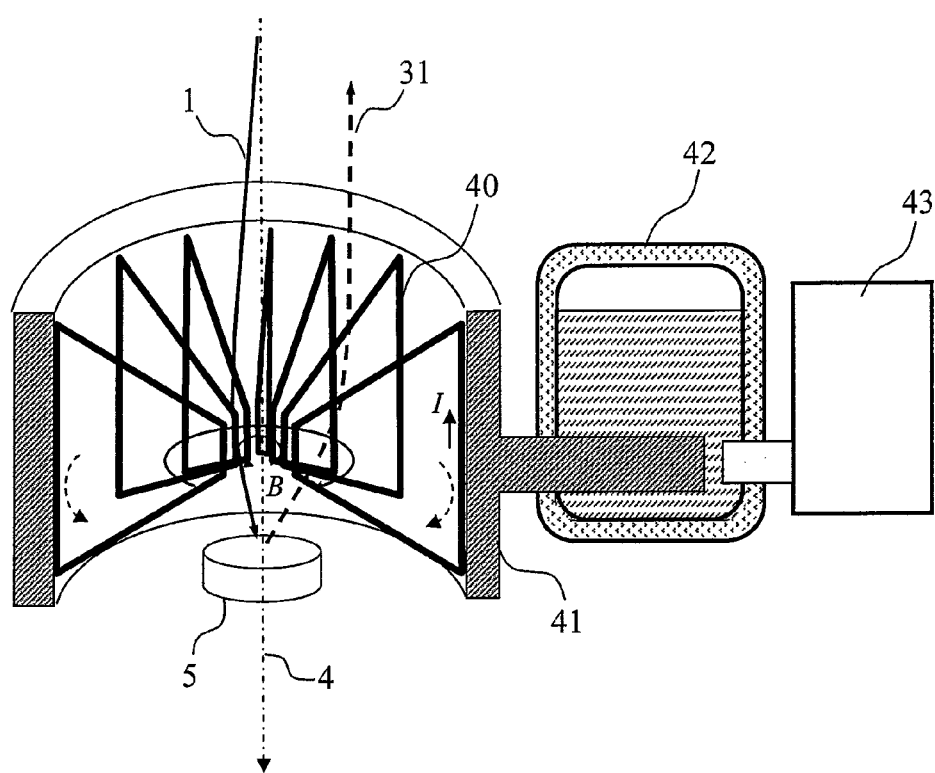
FIG. 18 is an illustration showing an example of a superconducting coil having an edge of an altered shape.

A first advantageous feature of the magnetic field type corrector according to the present invention is the ability to adjust a distribution of lines of magnetic force converging to the central axis of the coil by the number of turns of the coil and a coil winding distribution. For example, distributed-winding shown in FIG. 17 or a fringe configuration shown in FIG. 18 can be used to control a beam converging direction. With the arrangement of the coil shown in FIG. 8, a magnetic field becomes weaker outwardly farther away from an optical axis under the influence of an angular divergence determined by the number of parts into which the coil is divided. On the other hand, the distributed-winding shown in FIG. 17 is an instance where the number of turns of the coil 9 becomes larger so that the converging action becomes stronger, outwardly farther away from the rotation symmetry axis 4. FIG. 18 shows an instance where, likewise, an edge fringe configuration becomes longer so that the converging action becomes stronger, outwardly of the beam orbit. As mentioned above, the edge coil configuration or the distributed-winding can be used to achieve a high degree of correction.

With the coil 9 shown in FIG. 8, an increase in the number N of turns of the coil causes a reduction in beam transmittance due to the coil cutting off the beam, although yielding an increase in magnetic field intensity. Thus, an example shown in FIG. 18 is a method in which a superconducting coil 40 is used to increase a current and thereby produce an intense magnetic field. The superconducting coil 40 is connected to a cooling/introducing unit 41 to a liquefied helium tank 42 cooled by a heat exchanger 43, and cryogenic cooling and coil current excitation take place.

A second advantageous feature of the magnetic field type corrector according to the present invention is that the lens action changes from one to another of the converging and diverging actions according to the direction of beam transmission and the inside and outside of the coil. FIG. 18 shows an example of the magnetic field type corrector as used to bring the incoming beam 1 and the signal electrons 31 from the sample surface 5 into convergence. Specifically, the incoming beam 1 is brought through the center of the doughnut-shaped region of the toroidal coil 40 into convergence, and the signal charged particles 31 emitted from the sample surface 5 at varying angles are likewise brought through the coil 40 into convergence above the coil 40. Consequently, this enables achieving higher signal densities, thus achieving higher signal intensity even if a compact detector is used as the detector disposed above. Moreover, the signal charged particles can be passed through the inside of the coil 40 to diverge, and an annular detector having an incoming beam aperture at the center may be employed. At this point, it can be expected that a magnetic field in the vicinity of the rotation symmetry axis 4 of the toroidal coil 40 attenuates sharply toward the center, and the beam converging action in the vicinity of the axis also decreases, if the number of turns of the coil is large.

Further, a third advantageous feature of the magnetic field type corrector according to the present invention is to eliminate a rotating action of low-energy electrons in particular, which is a problem with a typical electromagnetic lens, and thus facilitate handling such as the dispositions of the deflector and the detector.

As is apparent from these examples, the present invention can achieve orbit correction for a charged particle beam, having a high degree of general versatility, such as aberration correction, compactly, at low cost, with a power supply included therein.

What is claimed is:

1. A charged particle beam orbit corrector for controlling an orbit of incidental charged particle beam by magnetic field, comprising:
   an inner cylinder having a cylindrical shape;
   an outer cylinder sharing same rotational symmetry axis of the inner cylinder;
   a path for the charged particle beam formed in a region between the inner cylinder and the outer cylinder; and
   a toroidal coil disposed in said region between the inner cylinder and the outer cylinder;
   wherein the number of turns of the toroidal coil changes with respect to the distance from the rotational symmetry axis.

2. The charged particle beam orbit corrector according to claim 1, wherein an electrically conductive film is formed on the surface of an insulating layer of the winding of the coil.

3. A charged particle beam orbit corrector for controlling an orbit of incidental charged particle beam by magnetic field, comprising:
   an inner cylinder having a cylindrical shape;
   an outer cylinder sharing same rotational symmetry axis of the inner cylinder;
   a path for the charged particle beam formed in a region between the inner cylinder and the outer cylinder; and
   a toroidal coil disposed in said region between the inner cylinder and the outer cylinder;
   wherein the length of the coil in a direction parallel to the incoming axis is larger at a side farther from the rotational symmetry axis than a side near the rotational symmetry axis.

4. A charged particle beam orbit corrector that has function for controlling an orbit of incidental charged particle beam, comprising:
   a cylindrical off-axis electrode that is grounded;
   a column disposed in coaxial with the grounded off-axis electrode;
   an axial electrode held at a tip of the column, of which length in a direction of the central axis of the off-axis electrode is shorter than that of the grounded off-axis electrode;
   a support that fixes the axial electrode and the grounded off-axis electrode;
   a ring zone aperture disposed at an incoming side of the charged particle beam, which is formed by the grounded off-axis electrode, the column and the support; and
   an insulator that insulates the axial electrode from the grounded off-axis electrode and the column.

5. The charged particle beam orbit corrector according to claim 4, wherein
   the grounded off-axis electrode is circumferentially divided into a plurality of electrode portions, and a voltage is applied to the electrode portions independently of one another.

6. The charged particle beam orbit corrector according to claim 4, wherein an electrically conductive shield is disposed around the charged particle beam orbit corrector.

7. The charged particle beam orbit corrector according to claim 4, wherein a magnetic field shield is disposed around the charged particle beam orbit corrector.

8. The charged particle beam orbit corrector according to claim 4, wherein an internal diameter of the grounded off-axis electrode increases from the incoming side of the charged particle beam to the outgoing side of the charged particle beam.

9. A charged particle beam apparatus, comprising:
   a charged particle beam emitted from a charged particle beam source into convergence, comprising:
   an optical converging system including an electromagnetic lens and a charged particle beam orbit corrector;
   the charged particle beam orbit corrector further including
      a cylindrical off-axis electrode that is grounded;
      an axial electrode held at a tip of the column, of which length in a direction of central axis of the grounded off-axis electrode is shorter than that of the off-axis electrode;
      a support that fixes the axial electrode and the grounded off-axis electrode;
      a ring zone aperture disposed at the incoming side of the charged particle beam, which is formed by the grounded off-axis electrode, the column and the support; and
      an insulator that insulates the axial electrode from the grounded off-axis electrode and the column.

10. The charged particle beam apparatus according to claim 9, wherein
    the grounded off-axis electrode is circumferentially divided into a plurality of electrode portions, and a voltage is applied to the electrode portions independently of one another.

11. The charged particle beam apparatus according to claim 9, wherein an electrically conductive shield is disposed around the charged particle beam orbit corrector.

12. The charged particle beam apparatus according to claim 9, wherein a magnetic field shield is disposed around the charged particle beam orbit corrector.

13. The charged particle beam apparatus according to claim 9, comprising:
    a projection lens that corrects a beam entry angle distribution of the charged particle beam; and
    an aligner that corrects an incoming direction of the beam.

14. The charged particle beam apparatus according to claim 9, wherein the charged particle beam orbit corrector is disposed on a principal plane or a coma-free plane of the electromagnetic lens.

15. The charged particle beam apparatus according to claim 9, comprising:
   a measuring means for measuring a height or surface potential of a sample surface,
   wherein a voltage applied to the axial electrode or the off-axis electrode of the charged particle beam orbit corrector is controlled as a function of measured values obtained by the measuring means.

16. The charged particle beam apparatus according to claim 9, comprising a heater that heats the charged particle beam orbit corrector.

17. The charged particle beam apparatus according to claim 9, comprising a cold trap mechanism disposed in the vicinity of the charged particle beam orbit corrector.

18. The charged particle beam orbit corrector according to claim 9, wherein an internal diameter of the grounded off-axis electrode increases from the incoming side of the charged particle beam to the outgoing side of the charged particle beam.

* * * * *